United States Patent [19]
Guegan

[11] Patent Number: 5,705,410
[45] Date of Patent: Jan. 6, 1998

[54] METHOD OF PRODUCING A SEMI-CONDUCTOR WITH A HIGHLY DOPED ZONE SITUATED BETWEEN LIGHTLY DOPED ZONES, FOR THE MANUFACTURE OF TRANSISTORS

[75] Inventor: Georges Guegan, Seyssins, France

[73] Assignee: Commissariat a l'Energie Atomique, Paris, France

[21] Appl. No.: 662,793

[22] Filed: Jun. 12, 1996

[30] Foreign Application Priority Data

Jun. 21, 1995 [FR] France ............... 95 07413

[51] Int. Cl.$^6$ .......................................... H01L 21/265
[52] U.S. Cl. .......................................... 437/35; 437/44
[58] Field of Search .......................................... 437/35, 44

[56] References Cited

U.S. PATENT DOCUMENTS

| | | |
|---|---|---|
| 4,232,439 | 11/1980 | Shibata . |
| 4,280,854 | 7/1981 | Shibata et al. ............... 437/35 |
| 4,921,812 | 5/1990 | Nagai ............... 437/35 |
| 5,217,910 | 6/1993 | Shimizu et al. ............... 437/35 |
| 5,240,874 | 8/1993 | Roberts ............... 437/35 |

FOREIGN PATENT DOCUMENTS

| | | |
|---|---|---|
| 404372124 | 12/1992 | Japan . |
| 5-136403 | 6/1993 | Japan . |

OTHER PUBLICATIONS

IBM Technical Disclosure Bulletin, vol. 14, No. 11, Apr. 1972, F.F. Fang, et al., "Forming Double Diffused Regions".
International Electron Devices Meeting 1993, pp. 131–134, Dec. 5–8, 1993, K.F. Lee, et al., "Room Temperature 0.1um CMOS Technology with 11.8 ps Gate Delay".
Physics and Technology of Semiconductor Devices, pp. 152–171, "Space–Charge Region for Step Junctions" 1967.
"Semiconductor Device Modeling with SPICE", pp. 144–145 Date Unknown.

Solid State Technology, pp. 29–38, Nov. 1992, R.B. Simonton, et al., "Process Control Issues for Ion Implantation Using Large Tilt Angles and Wafer Repositioning".
IEDM 89, pp. 777–780, 1989, T. Hori, "¼–um LATID (LArge–Tilt–angle Implanted Drain) Technology for 3.3–V Operation" Month Unknown.
IEDM 88, pp. 394–397, 1988, T. Hori, et al., "A New Half–Micron p–Channel MOSFET with LATIPS (LArge–Tilt–Angle Implanted Punchthrough Stopper)" Month Unknown.
T. Skotnicki, et al., "Channel Engineering by Heavy Ion Implants", pp. 671–674, 1994.
IEEE Electron Device Letters, vol. 14, No. 10, pp. 466–468, Oct. 1993, G.G. Shahidi, et al., "High–Performance Devices for a 0.15–um CMOS Technology".
1994 Symposium on VLSI Technology Digest of Technical Papers, pp. 19–20, 1994, K. Noda, et al., "0.1um Delta–Doped MOSFET Using Post Low–Energy Implanting Selective Epitaxy" Month Unknown.
Electronics Letters, vol. 24, No. 3, pp. 146–147, Feb. 4, 1988, "Study of the Operation Speed of Half–Micron Design Rule CMOS Ring Oscillators", Yoshimi et al.
Ghandhi, Sorab K. "VLSI Fabrication Principles Silicon and Gallium Arsenide", Second Edition, John Wiley & Sons, Inc., pp. 420–428.

*Primary Examiner*—John Niebling
*Assistant Examiner*—Michael S. Lebentritt
*Attorney, Agent, or Firm*—Oblon, Spivak, McClelland, Maier & Neustadt, P.C.

[57] ABSTRACT

A method of producing a transistor with a highly doped zone situated between lightly doped zones. This method comprises: a first oblique implant of ions (100) into a first and a second zone (144, 142), a mask (114) being formed at the periphery of a third zone in order to protect the third zone from the ions of the first implant, a second oblique implant of ions (130) into the first and third zones, a mask (115) being formed at the periphery of the second zone (142) in order to protect the second zone (142) from the ions (130) of the second implant, then the formation of a gate of the transistor.

6 Claims, 3 Drawing Sheets

1

METHOD OF PRODUCING A SEMI-CONDUCTOR WITH A HIGHLY DOPED ZONE SITUATED BETWEEN LIGHTLY DOPED ZONES, FOR THE MANUFACTURE OF TRANSISTORS

DESCRIPTION

1. Technological Field

This invention relates to a method of producing a semiconductor substrate comprising first, second and third juxtaposed doped zones, the first zone being situated between the second and the third zones and having a mean doping concentration greater than that of the second and third zones.

The invention finds applications in the fields of microelectronics relating to the production of integrated circuits and transistors. It is applicable, in particular, to the manufacture of MOS (Metal Oxide Semi-conductor) type transistors, CMOS (Complementary Metal Oxide Semi-conductor) type structures, MIS type transistors, junction field effect transistors (JFET), and bipolar transistors.

2. State of the Prior Art

The speed performance of integrated circuits and transistors which also affects the frequency band width of these devices, depends notably on the current that they are capable of supplying and their charge capacitance.

By charge capacitance, one understands an electrical capacitance, including parasitic capacitances of three different types. The charge capacitance, first of all includes an intrinsic input capacitance of the active gate(s) of the transistor or of the integrated circuit. It then includes a parasitic capacitance due to the connecting lines of the components, to the interconnections between the different parts of the circuits and, for the transistors, to the overlaying of the source and the drain by the gate. The charge capacitance finally includes a parasitic capacitance due to the junctions between, on the one hand, the source and the drain of the transistors, and, on the other hand, caissons of the substrate in which these transistors are produced.

The relative importance of the charge capacitance and its different components used to be low compared with that of the intrinsic input capacitance of old circuits or assemblies where the typical size of components was greater than a micrometer.

At the present time, with the decrease in the size of components, the relative size of the parasitic capacitances is tending to increase. The increase in parasitic capacitance associated with junctions illustrates this tendency.

In effect, an ever higher doping of the substrates, necessary to avoid breakdown in miniaturised circuits, increases the parasitic capacitance of junctions which can represent 20% to 30% of the total charge capacitance, depending on the type of circuit.

The effect of this parasitic capacitance on the speed performance of the circuits is illustrated, for example, by the calculation of the simulated multiplication time, with a 16 bits by 16 bits multiplier of the 0.35 µm CMOS type. It is noted that, in this example, when the parasitic capacitances associated with the junctions and metal connection lines are disregarded, the multiplication time is of the order of 4.6 ns. On the other hand, when the parasitic capacitances associated with the junctions are taken into the calculation, disregarding the other parasitic capacitances, the multiplication time increases and exceeds 5.5 ns.

Hence, the search for maximum performance in terms of speed of the circuits leads, on the one hand (as mentioned above) to increasing the current supplied by the transistors while reducing, for example, the lengths of their gates and the thicknesses of the gate oxides, and, on the other hand, to reducing the parasitic capacitances, particularly the parasitic capacitances from the junctions between the transistor caisson and the source and drain regions.

A known technique for reducing the capacitances of the junctions consists of carrying out high concentration ionic implants in the channel of the transistors, under the gate. For this subject, reference can be made to documents (1) and (2) referred to at the end of this specification.

The purpose of the ionic implant is to carry out a high concentration doping of the channel. FIGS. 1 to 3 show; for the purposes of illustration, the different steps in the manufacture of a transistor with a CMOS type structure, according to this technique.

As shown in FIG. 1, first of all, a caisson 12 is formed in a substrate 10 by an ionic implant designated by reference number 14. In the case of the example described, the caisson 12 is of p type for the production of an NMOS type component. During the ion implant leading to a p type doping, a resin mask 16 allows one to protect the other parts of the substrate (not shown) on which one wishes to produce n type caissons. On the surface of the substrate 10, the caisson 12 is defined and insulated by field oxide paving 18.

A second ion implant leading to p type doping, designated by reference number 20 in FIG. 2 is carried out in a localised fashion in a region corresponding to the channel 22 of the NMOS transistor. During this second implant, a mask 24 protects the future source and drain regions, as well as possible neighbouring n type caissons which are not visible in the figure. Of course, to produce PMOS type transistors, implants 14 and 20 are replaced by ion implants leading to an n type doping. The masks 16 and 24 then allow protection of neighbouring p type caissons during these implants.

Manufacture proceeds, as shown in FIG. 3, with the creation of the sources, drains and gates. The sources 26 and the drains 28 are produced by an ion implant leading to an n type doping in the p type caissons and by an ion implant leading to a p type doping in the n type caissons.

For each type of transistor, NMOS or PMOS, this operation requires therefore a mask formation step and an ion implant step. This permits to optimise separately the manufacture of the transistors with regard to constraints linked to the production of the caisson and those linked to the shape and to the dimensions of the channel.

The described technique has however a certain number of limitations essentially linked to the need for a large number of manufacturing steps, and particularly the formation of the masks. Difficulties also arise because of the relatively critical alignment of the gate 30 and the channel 22. In effect, the precision of the overlaying of the gate pattern and the channel, or of the mask 24 defining the channel depends fundamentally on the transistor manufacturing tool and hence on its price. As an example, the offset between the gate 30 and the channel 22, designated by D in FIG. 3, can vary by 20% to 40% of the length of the gate.

A second method for manufacturing transistors with reduced charge capacitance is described in document (3) referred to at the end of this description. According to this document, the reduction in the capacitances of the source/caisson junctions and drain/caisson junctions results from the formation of the channel by selective epitaxy after an ionic implant of $BF_2$. The doping profile, relatively steep, has a maximum concentration ($N=1.0.10^{18}$) at a depth of 0.1 µm, measured from the gate oxide-silicon interface. Outside this region, the doping concentration is lower ($1.0.10^{16}$).

This method also has a certain number of limitations. Among these, one may note, for example, the creation of crystalline defects in the transition zone between the silicon region where the transistor is formed and the field oxide pavings defining this region. Furthermore, implementation of the method is delicate. In particular, control of the doping must be very precise under pain of a large scatter in the electrical parameters of the transistors produced. Finally, the formation and definition of the channel by selective epitaxy is a costly route for the production of MOS type devices.

In a third known method for the production of transistors with low parasitic capacitances, the channel is defined by an implant of heavy ions. For this subject, reference is made to documents (4) and (5) referred to at the end of this description.

Conforming to this method, the doping profile of the channel of the transistors is optimised by an implant of heavy ions such as indium ions for NMOS type transistors and antimony ions for PMOS type transistors.

This method, simpler to implement than selective epitaxy, incorporates difficulties linked, for example, to activation of indium for high implant doses.

The object of this invention is to provide a simple method that allows the production of transistors with reduced parasitic capacitances associated with source/caisson and drain/caisson junctions, and not having the limitations mentioned above.

An object is also to provide a transistor with a reduced caisson doping concentration in the source/caisson and drain/caisson regions.

In a more general way, an object of the invention is to provide a method, simple to implement, allowing the production, in a substrate of a highly doped zone, inserted between more lightly doped zones, by taking advantage of the possibilities offered by present day ion implanters which allow the implant of ions with a large angle of incidence with respect to the substrate.

Documents (6), (7) and (8) referred to at the end of this description allow better understanding of the oblique ion implant techniques, that is to say, with an angle of inclination with respect to the surface of the substrate.

DISCLOSURE OF THE INVENTION

In order to achieve the objects explained above, the object of the invention, in a general way, is a method of producing a transistor in a semi-conductor substrate including first, second and third juxtaposed doped zones, including respectively the channel, the source and the drain of the transistor, the first zone being situated between the second and the third zones and having a mean doping concentration greater than that of the second and third zones, characterised in that the method comprises the following steps:

- a first oblique implant of ions into the first and the second zone with a first implant angle α, a first implant dose D and a first implant energy E, a mask being formed at the periphery of the third zone outside the first, second and third zones, this mask having sufficient thickness, chosen as a function of the first implant angle α, the first implant dose D and the first implant energy E to protect the third zone from the ions of the first implant.

- a second oblique implant of ions into the first and third zones with a second implant angle α', a second implant dose D' and a second implant energy E', a mask being formed at the periphery of the second zone, outside the first, second and third zones, the mask having sufficient thickness, chosen as a function of the second implant angle, the second implant dose D' and the second implant energy to protect the second zone from the ions of the second implant.

- formation, after the first and second implants of a gate oxide layer and a gate above the first zone and formation of a drain and of a source in the second and third zones, the masks at the periphery of the second and third zones being formed before the first and second implants, the first and second implants being carried out with the ions leading to doping of the same conduction type.

By implant angle, one refers to the angle that the direction of the ion implant forms with the normal of the surface of the semi-conductor substrate.

According to one aspect of the invention, the masks formed at the periphery of the second and third zones can be produced simultaneously. These masks can, in particular, be formed in the same resin layer.

The gate oxide layer and the gate are formed in a step after the first and second implants to prevent distortion of these parts under the effect of the implanted ions.

Furthermore, it is also possible to carry out the first and second implants with angles of the same size and of opposite sign, and with equal energies. In this case, the masks formed at the periphery of the implant zones preferably have identical thicknesses.

According to one aspect of the invention, the first and second implants can be carried out through a sacrificial oxide layer formed on the surface of the first, second and third zones.

In one particular preferred implementation of the method, the size of the implant angles, the energy of the implants and the height of the masks can be chosen so that during the first and second implants, the zones protected by a mask have respectively a length $L_1$ measured from the field oxide paving defining the transistor, and the implanted zones have a length $L_2$ where $L_2 > L_1$, $L_1$ and $L_2$ being measured in a direction of flow of electrical carriers (electrons or holes) in the transistor.

Similarly, the size of the implant angles, the energy of the implants and the height of the masks can be chosen so that the length $L_c$ of the first zone, comprising the transistor channel is greater than the length $L_g$ of a gate of this transistor, the lengths $L_c$ and $L_g$ being measured in a direction of flow of carriers in the transistor.

Other characteristics and advantages of the invention will emerge from the description which will follow, which is purely for illustrative purposes and is non-limitative, and which makes reference to the appended drawings.

DETAILED DESCRIPTION OF WAYS OF IMPLEMENTING THE INVENTION

Figure 1:
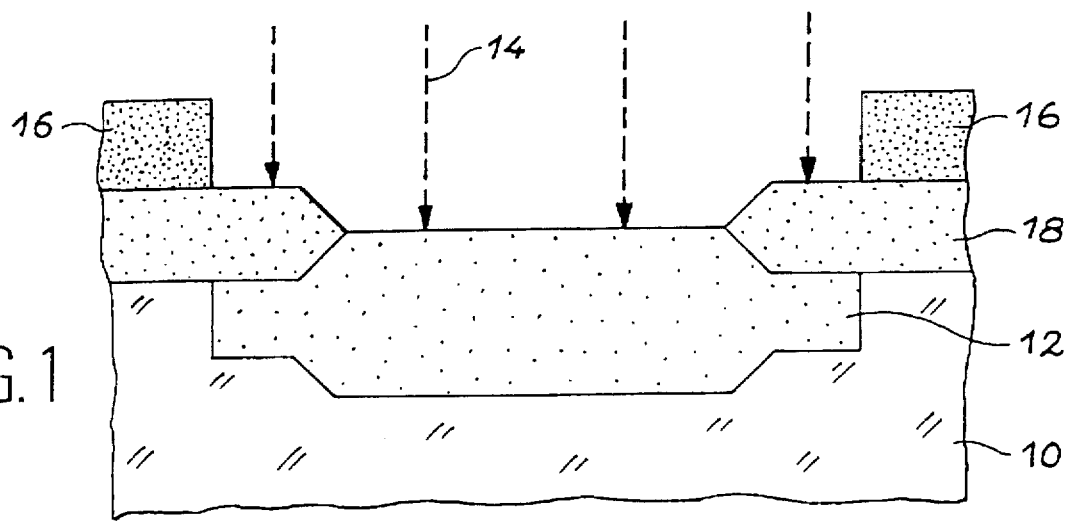
FIGS. 1 to 3, already described, are cross-sections of part of a CMOS type structure, and in particular NMOS illustrating a known method for the creation of a structure having lower doping in the source and drain regions than in the channel region.
Figure 2:
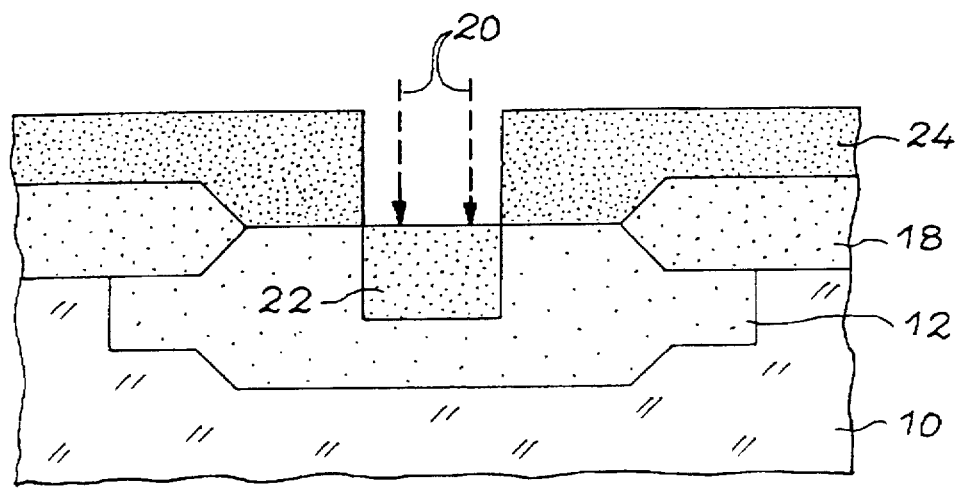
Figure 3:
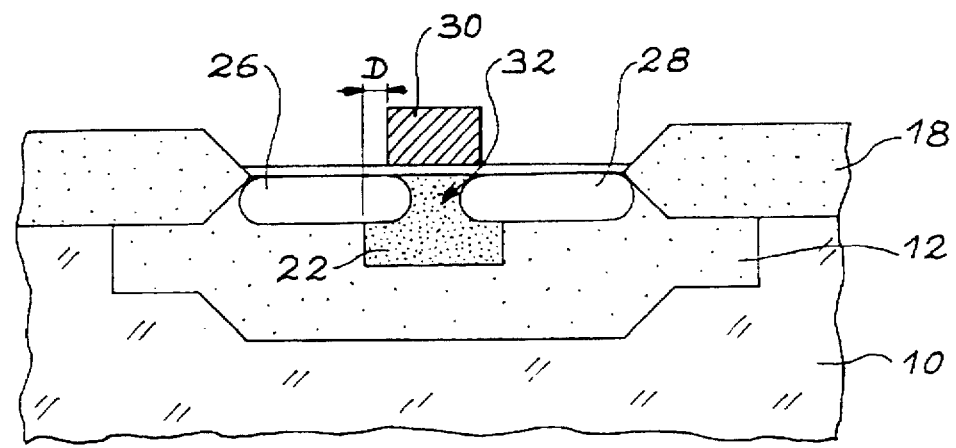
Figure 4:
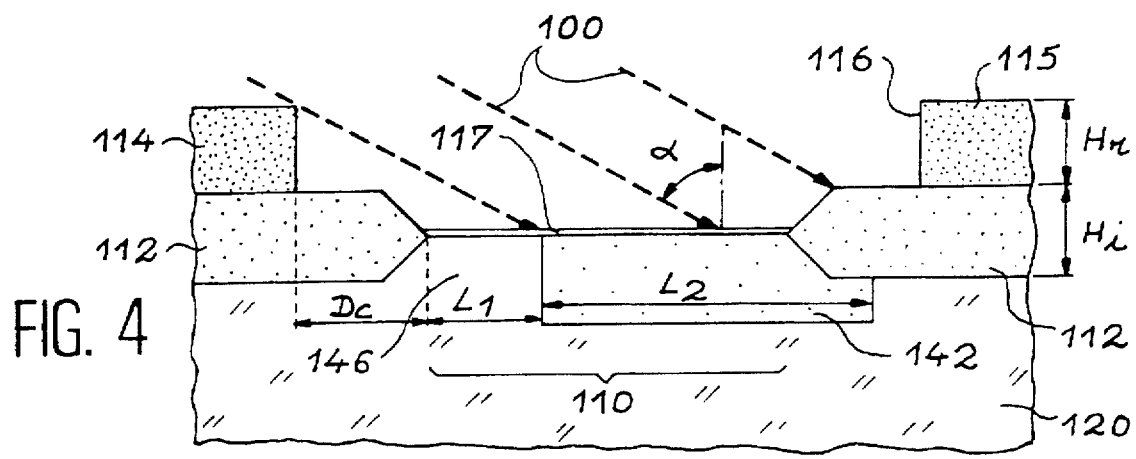
FIGS. 4 and 5 are diagrammatic cross-sections of part of a substrate illustrating the formation in this substrate of doped zones, in accordance with the invention.

As shown in FIG. 4, the method of the invention comprises a first ion implant 100 in a part 110, called active zone, of a substrate 120 in which it is desired to create, for example, a CMOS type circuit transistor. The part 110 is defined by the field oxide pavings 112. In the case where the substrate 120 is silicon, they are, for example, silicon oxide parings.

Preferably, a layer of sacrificial oxide 117 is formed on the surface of the active zone before carrying out the first implant. This layer allows dechanneling of the implanted ions and prevents the implanted ions from penetrating too far into the substrate. It also serves to protect against possible contamination due to the implanter. The layer 117, for example an $SiO_2$ layer, is obtained in an oxidising atmosphere and is deposited at low temperature, for example. Its thickness is chosen to be sufficiently small so that the implants are not masked and sufficiently thick to compensate for possible disturbances that its production induces in the substrate. Its thickness is, for example 20 nm.

The first implant is carried out with the ions leading to a doping of the first type of conductivity with a first implant angle $\alpha$ defined with respect to the normal at the surface of the substrate 120 and with a first implant energy. The doping may be of p type, for the production of a NMOS type transistor and of n type, for the production of a PMOS type transistor. The first implant, and the following steps of the method can involve just one, but also and preferably a plurality of transistors manufactured simultaneously. By way of example, boron ions are implanted for a NMOS transistor with a dose of some $10^{12}$ at/cm$^2$ so as to form doped zones with a mean concentration of some $10^{16}$ at/cm$^3$. The dose is determined in relation to the length of the gate to be produced.

A mask 114, 115, with an aperture 116 opposite zone 110, is formed on the field oxide parings 112. In the case of FIG. 4, the parts of the mask 114 and 115 formed on both sides, at the periphery of zone 110 are produced simultaneously in the same resin layer, and have therefore, the same thickness.

During the first implant, the part of the mask 114 stops ions 100 in a zone 140 of length $L_1$ measured from the edge of the field oxide 112, so that the implant only takes place within a zone 142 whose length is designated by $L_2$ on the Figure. The lengths $L_1$ and $L_2$ are considered in the section plane of the Figures which corresponds approximately to the direction of flow of the electrical carriers in the finally produced structure. Also $D_c$ designates the distance separating the edge of the field oxide facing the region 140 and the edge of the mask.

To modify and to adjust the lengths $L_1$ and $L_2$ it is possible to operate notably on the mask height.

Figure 5:
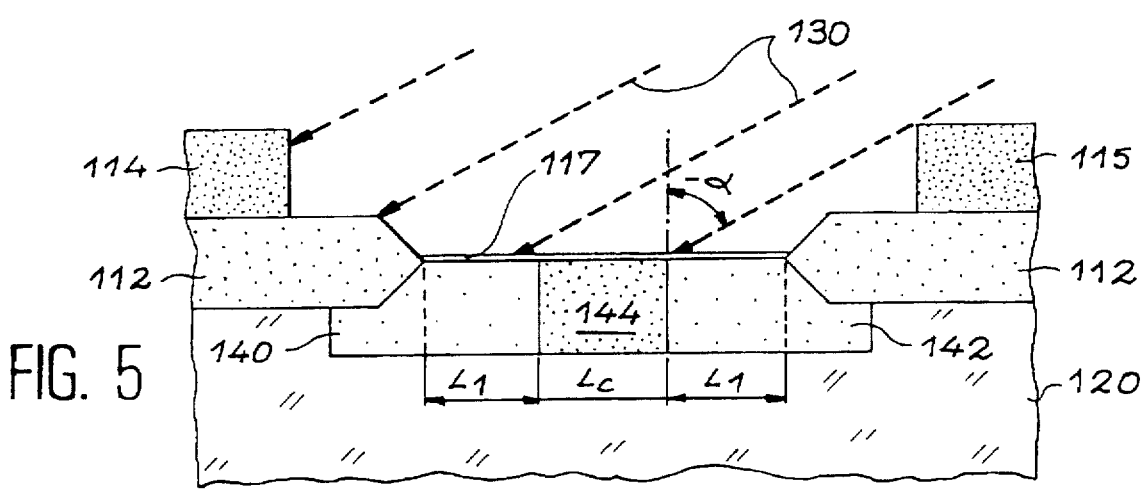

As shown in FIG. 5, a second implant is, in the case of the example described, created with an angle $-\alpha$ with ions 130 leading to a doping with the same type of conductivity, and with an identical energy to that of the first implant. The second implant is also carried out through the sacrificial layer 117. By way of example, the second implant can be carried out with boron ions for an NMOS transistor with a dose of some $10^{12}$ at/cm$^3$ to form the doped zones with a concentration of some $10^{16}$ at/cm$^3$. This second implant can be carried out in a simple way by pivoting the substrate in the implantation device by an angle of 180°.

During the second implant, the mask part 115 plays a role similar to that of the mask part 114 during the first implant.

The mask 115 stops the implant ions 130 in the zone 142. The ions 130 can, on the other hand, reach the zone 140 which has been protected by the mask 114 during the first implant as well as zone 144. Zone 144, whose length, in the plane of the Figure, is indicated $L_c$ in FIG. 5, is a zone which has been subjected to the first and the second ion implants. It has not been protected by any of mask parts 114, 115. Hence the doping concentration here is greater than that in zones 140 and 142. For reasons of symmetry respected in the application example described, zone 142 also has a length $L_1$ measured from the field oxide 112 which borders it. It should also be noted that doped zones 140 and 142 extend to a certain length under the field oxide paving. Furthermore, because of the oblique nature of the implants, the interfaces between the different doped zones have bevelled profiles.

After the first and second implants, the sacrificial layer 117 is removed.

Figure 6:
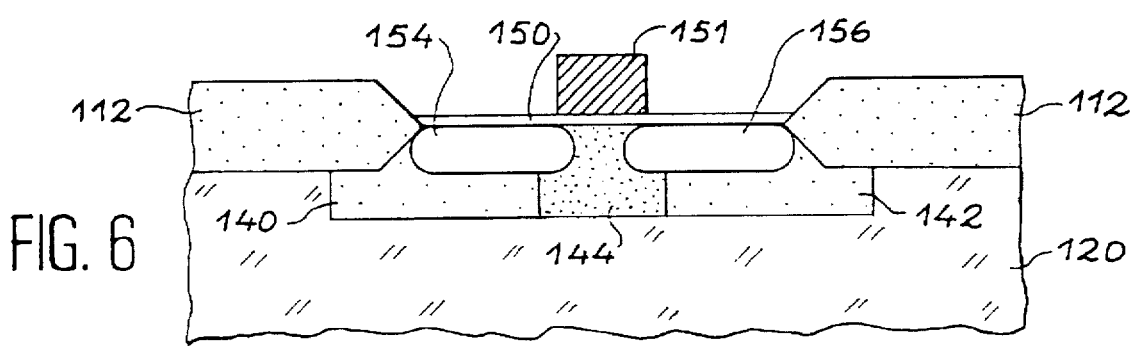
FIG. 6 is a diagrammatic cross-section of a transistor produced in accordance with the invention from the substrate of FIG. 5, FIGS. 7 to 9 are sections of parts of semi-conductor substrates treated in accordance with the invention and illustrating the choice of implant parameters for the implementation of the method of the invention.

Zones 140, 142 and 144 formed in substrate 120 are used, as shown in FIG. 6 to create a transistor. These zones can, in effect comprise the source, the drain and the channel of a transistor. Zone 144 corresponds to the channel which has the highest doping concentration. The source and the drain can be formed in either of the more lightly doped zones 140 and 142 respectively.

A layer 150, referred to as gate oxide is formed on the surface of the substrate 120 in zone 110, then a gate 151 is formed on this layer 150 above zone 144. The gate is formed in accordance with lithographic and etching methods known per se. Similarly, a source 154 and a drain 156 are formed on either side of the gate 151, in zones 140 and 142 by ion implant leading to doping of an opposite conductivity type to that obtained with the ions of the first and second implants. In the case of an NMOS type transistor, the drain and the source are of n type. The source and drain implant is carried out usually approximately perpendicular to the substrate 120. It should be noted that the formation of the gate and the source and drain zones is subsequent to the oblique implant steps.

The steps of manufacturing the gate and of implanting the source and drain are identical to those carried out for NMOS transistors of known type. Reference can be made to this subject, for example, in document (9) referred to at the end of this specification.

The height of the resin mask 114, 115, the dose, the implant energy and angles are chosen so that during the first and second implants, the length of the implanted regions $L_2$ is greater than the length $L_1$.

Furthermore, to produce a transistor conforming to FIG. 6, the following relationship should be verified:

$$L_c = L_2 - L_1 - D_c \geq L_g$$

where $L_g$ is the length of the gate between the source and the drain.

Figure 7:
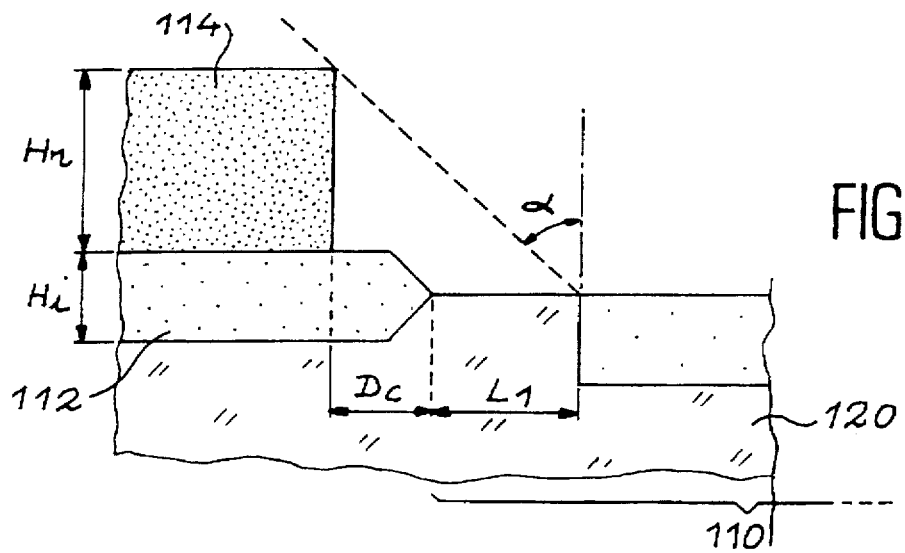
Figure 8:
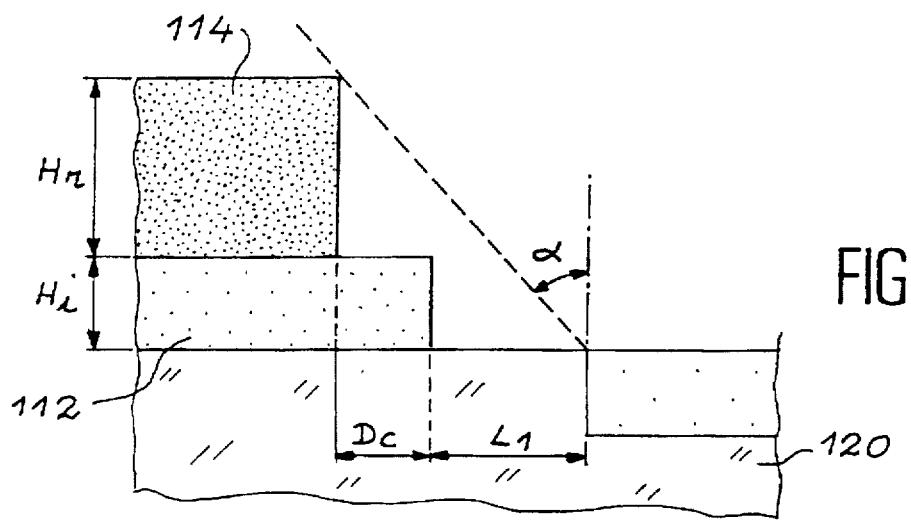
Figure 9:
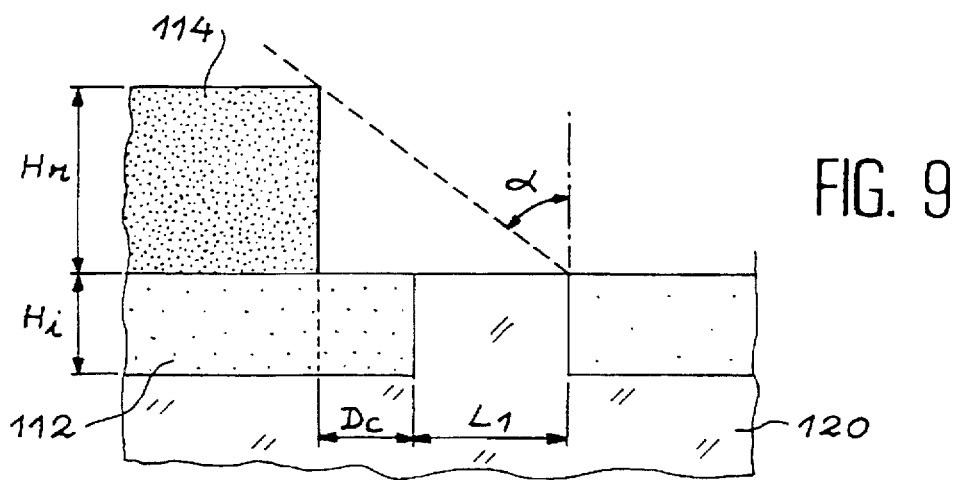

FIGS. 7, 8 and 9 allow the parameters which characterise the oblique ion implants according to the invention to be shown more precisely. In FIGS. 7, 8 and 9, which correspond to partial views of FIG. 6, elements or parts identical or similar to those in FIGS. 5 and 6 are to be found. These elements or parts have the same reference numbers as on these Figures and when dealing with them, reference can be made to the preceding description.

FIG. 7 gives an example where the field oxide paving 112 is half buried in the substrate 120. FIG. 8 illustrates the case where the field oxide paving is not buried, whilst FIG. 9 shows a field oxide paving 112, completely buried in the substrate. A parameter $K_1$ is associated with these three situations, such that $K_1=1$ for a non-buried, field oxide paving, $K=0.5$ for a semi-buried field oxide paving and $K=0$ for a buried field oxide paving.

In the Figures, $H_i$ and $H_r$ indicate respectively the height of the field oxide paving and that of the resin mask 114.

The total length of the active zone 110 is equal to the sum of the length of the channel indicated by $L_c$ and the lengths of the source and drain indicated respectively by $L_1S$ and $L_1D$. Hence, taking into consideration that the lengths $L_1S$ and $L_1D$ are approximately equal to the length $L_1$ defined above, the height of the mask $H_r$ is linked to the oblique ionic implant angle α by the following relation:

$$H_r = (D_c + L_1) t g \alpha - K_1 H_i$$

wherein $D_c$ represents, as previously, the distance between the edge of the active zone (and of the oxide paving) and the edge of the mask.

As document (10), referred to at the end of this description, shows, in the case of an abrupt junction formed by doping using a constant vertical implant, the source/caisson or drain/caisson junction capacitance per surface unit is expressed in the following form:

$$C_j = C_{j0} / (V + \phi_{diff})^{1/2}$$

where V represents the voltage applied to the junction, $\phi_{diff}$ the diffusion voltage of the diode with:

$$C_{j0} = (q^e 0^e SI N/2)^{1/2}$$

where $q^e 0^e SI$ represents the permittivity of silicon, q the charge of an electron and N the mean doping of the caisson.

Also, it should be noted that, with respect to a known CMOS type structure, the method of the invention allows the parasitic capacitances associated with the source/caisson and drain/caisson junctions to be divided by 1.414 whatever the type of transistor (NMOS or PMOS) and this, without an increase in the number of manufacturing steps.

By way of example, for a CMOS circuit of the 0.35 μm type, having a mean doping concentration of $1.10^{17}$ cm$^{-3}$ in the channel region, fixed in relation to resistance to breakdown criteria, the capacitance per unit area of the junctions is 1.08 fF/μm$^2$, in the case of a conventional manufacture.

In the case of manufacture conforming to the invention, the doping concentration under the source and drain junctions is reduced to $5.0.10^{16}$ cm$^{-3}$ and the capacitance per unit area is in the order of 0.76 fF/μm$^2$.

In the example above, the height of the resin mask for the first and second implants is 1.6 μm. It is calculated from the following values:

α=45° (oblique ionic implant angle)

$H_i$=0.40 μm (height of the filed insulation)

$D_c$=0.8 μm $L_1$=1.0 μm (length of the source and drain region)

Finally, thanks to the invention, it is possible to produce circuits in a simple fashion, and, in particular, transistors with low parasitic capacitances. These circuits or these transistors are therefore faster. The method of the invention can be very widely used for the manufacture of MOS transistors, such as those described above, and also for the manufacture of MIS, JFET or bipolar type transistors.

DOCUMENTS MENTIONED IN THIS DESCRIPTION (1) K. F. LEE et al. "Room Temperature 0.1 μm CMOS Technology with 11.8 ps Gate Delay", Tech. Digest, IEDM 1993, pp. 131–134

(2) M. YOSHIMI et al. "Study of the operation speed of half-micron design rule CMOS Ring oscillators", Electronics letters, vol. 24, No. 3, February 1988

(3) K. NODA et al. "0.1 μm Delta doped MOSFET using post low-energy implanting selective epitaxy", Symposium on VLSI Technology Digest of Technical Papers, 1994, pp. 19–20

(4) G. G. SHAHIDI et al. "High Performance devices for a 0.15 μm CMOS Technology", IEEE Electron Device Letters, vol. 14, No. 10, October 1993

(5) T. SKOTNICKI et al. "Channel Engineering by heavy ion implants", ESSDERC '94, Tech. Digest, pp. 671–674

(6) T. HORI "¼ μm LATID (Large-Tilt-Angle Implanted-Drain) Technology for 3.3 V Operation" IEDM 1989, Tech. Digest, pp. 777–780

(7) T. HORI, K. KURIMOTO "A New Half-micron p-channel MOSFET with LATIPS (Large-Tilt-Angle Implanted Punchthrough Stopper)", IEDM 1988, Tech. Digest, pp. 394–397

(8) R. B. SIMONTON, D. E. KAMENITSA, A. M. RAY "Process Control issues for Ions Implantation Using Large Tilt Angles and Wafer Repositioning", Solid State Technology, November 1992, pp. 29–38

(9) Semiconductor device Modelling with SPICE Editor Paolo Antognetti, McGraw-Hill International Editions

(10) A. S. GROVE "Physics and Technology of Semiconductor Devices", John Wiley and Sons—New York 1967

I claim:

1. A method of producing a transistor in a semiconductor substrate comprising first, second and third juxtaposed doped zones, including respectively the channel, the source and the drain of the transistor, the first zone being situated between the second and the third zones and having a mean doping concentration greater than that of the second and third zones, characterised in that the method comprises the following steps:

a first oblique implant of ions into the first and the second zones with a first implant angle, a first implant dose and a first implant energy, a mask being formed at the periphery of the third zone outside the first, second and third zones, this mask having sufficient thickness, chosen as a function of the first implant angle, the first dose and the first implant energy to protect the third zone from the ions of the first implant, a second oblique implant of ions into the first and third zones with a second implant angle, a second implant dose and a second implant energy, a mask being formed at the periphery of the second zone, outside the first, second and third zones, the mask having sufficient thickness, chosen as a function of the second implant angle, the second dose and the second implant energy to protect the second zone from the ions of the second implant, formation after the first and second implants of a gate oxide layer and a gate above the first zone and formation of a drain and of a source in the second and third zones, the masks at the periphery of the second and third zones being formed before the first and second implants and wherein the first and second implants are of the same conductivity type.

2. A method according to claim 1, characterised in that the masks formed at the periphery of the second and third zones, are formed simultaneously.

3. A method of producing a semi-conductor according to claim 1, characterised in that the first and second implants are carried out through a sacrificial oxide layer formed on the surface of the first, second and third zones.

4. A method according to claim 1, characterised in that the first and second implant angles have an identical size and an opposite sign, that the first implant dose and the second implant dose are identical, that the first and the second implant energies are identical and that the masks formed at the periphery of the second and third zones have identical thicknesses.

5. A method according to claim 1, characterised in that the size of the implant angles, the implant doses, the implant energy and the height of the masks are chosen so that during the first and second implants, the zones protected by a mask have respectively a length $L_1$, and the implanted zones have a length $L_2$ such that $L_2 > L_1$, $L_1$, and $L_2$ being measured in a direction of charge flow in the transistor.

6. A method according to claim 1, characterised in that the size of the implant angles, the implant dose, the energy of the implants and the height of the masks are chosen so that the length $L_c$ of the first zone, comprising the transistor channel is greater than the length $L_g$ of a gate of this transistor, the lengths $L_c$ and $L_g$ being measured in a direction of flow of carriers in the transistor.

* * * * *